US00RE36261E

United States Patent [19]

Chin et al.

[11] E Patent Number: Re. 36,261

[45] Reissued Date of Patent: Aug. 3, 1999

[54] STACK CAPACITOR DRAM CELL HAVING INCREASED CAPACITOR AREA

[75] Inventors: Dae-Je Chin, Seoul; Tae-Young Chung, Kyungki-do, both of Rep. of Korea

[73] Assignee: Samsung Electronics Co., Ltd., Suwon, Rep. of Korea

[21] Appl. No.: 08/761,082

[22] Filed: Dec. 4, 1996

Related U.S. Patent Documents

Reissue of:

[64] Patent No.: 5,378,908
Issued: Jan. 3, 1995
Appl. No.: 07/283,968
Filed: Dec. 13, 1988

[30] Foreign Application Priority Data

Jun. 7, 1988 [KR] Rep. of Korea ..... 88-6796

[51] Int. Cl.[6] ..... H01L 29/78; H01L 29/92

[52] U.S. Cl. ..... 257/309; 257/306; 257/756

[58] Field of Search ..... 257/306, 309, 257/756

[56] References Cited

U.S. PATENT DOCUMENTS 4,635,090 1/1987 Tamaki et al. ..... 257/513
4,641,166 2/1987 Takamae et al. ..... 257/306
4,742,018 5/1988 Kimura et al. ..... 438/253
4,754,313 6/1988 Takamae et al. ..... 257/306
4,974,040 11/1990 Taguchi et al. ..... 257/306
5,047,817 9/1991 Wakamiya et al. ..... 257/306

FOREIGN PATENT DOCUMENTS 58-213461 12/1983 Japan ..... 357/23.6

*Primary Examiner*—William Mintel
*Attorney, Agent, or Firm*—Jones & Volentine, L.L.P.

[57] ABSTRACT

A saddled and wrapped stack capacitor DRAM and a method thereof are provided. The DRAM of the invention includes three factors in increasing the effective area for a capacitor. One is a storage poly layer comprising a first poly layer and a second poly layer, which is formed thick in a region over a field oxide layer through two steps; another is a spacer which is formed through an etchback technique for an oxide layer coated on another oxide layer being patterened to selectively remove the storage poly layer, and the spacer maximizes the size of the storage poly; another is an undercut which is formed in boundary regions on an upper oxide layer, on which a [plat] *plate* poly material is coated and wrapped.

43 Claims, 9 Drawing Sheets

STACK CAPACITOR DRAM CELL HAVING INCREASED CAPACITOR AREA

Matter enclosed in heavy brackets [ ] appears in the original patent but forms no part of this reissue specification; matter printed in italics indicates the additions made by reissue.

BACKGROUND OF THE INVENTION

This invention relates to DRAM(Dynamic Random Access Memory) cells and a method for manufacturing them, and more particularly to a stacked capacitor DRAM cell which can obtain a high-capacitance without the increment of capacitor area in a semiconductor device. Recently, in the field of DRAM technology, the effort of minimizing the chip size has been completed, while the capacitance value needed for each cell has been maintained. According to such *a* trend, the trench capacitor DRAM cell and stacked capacitor DRAM cell [came on] *were developed*. These techniques contributed largely to the high-density DRAM technology.

To explain the method for manufacturing a stacked capacitor DRAM cell, referring to FIG. 1 which shows the vertical cross-sectional view of a stacked capacitor DRAM cell, the fabricating processes of the stacked capacitor DRAM cell are as follows.

At first, a p-well 32 is formed on a p-type substrate 31. A field oxide 34 is grown on an active region over the p-well, and a $p^+$ layer is formed by injecting impurities. After above processes a gate poly 35 and a source-drain region for transistors are formed, and a contact is formed to form a storage poly 41, and said storage poly is etched selectively.

Thereafter, an insulating layer 46 for a capacitor is formed by oxidizing said storage poly, and a plate poly 48 is deposited. The layers of an oxide 49, a polycide 50, a B-PSG 51 and a metal 52 are formed in sequence[, now] . *Now* the series of processes for manufacturing a DRAM cell are completed.

The effective area of a capacitor 41 of a DRAM cell manufactured by the above described way is determined by the top and side area of the storage poly. To increase the effective area of the stacked capacitor, the thickness of the storage poly 41 is increased up to now.

However, the magnitude of the capacitance manufactured by way of increasing the side area is not sufficient for high-density memories because the cell area of a 4M DRAM is 10 $\mu m^2$, but that of a 16M DRAM reduces to 5 $\mu m^2$. The increment of thickness of the storage poly in the entire area of the cell causes the deterioration of cell topology so that the patterning of the storage poly and the bit-line and the metal is difficult. The manufacturing of the high-density DRAMS beyond 4M DRAM is difficult by the conventional technology. The reason is that the capacitance per unit cell reduces remarkably when the 16M DRAM is manufactured by the prior technology.

SUMMARY OF THE INVENTION

The object of the invention is to provide a stacked capacitor DRAM cell and a method thereof which makes the manufacturing of a 16M DRAM possible by maximizing the effective area of the stacked capacitor in a confined area.

The invention, in a first aspect, is a stacked capacitor DRAM in which the effective area of the capacitor is maximized with a storage poly layer for capacitor. There are three factors in increasing the effective area according to the present invention.

One factor is that the storage poly layer [which] is formed thick in a region over the field oxide layer. That is, the region in the storage poly layer over the field oxide layer is twice coated by the polysilicon so that the capacitance increases as much as that.

When a first poly layer is removed except the portion over the field oxide layer, it is preferable to use a saddle mask. That is because the etched surface of the storage poly layer is very rough, and this conditions makes the effective area for the capacitor increase in a large scale.

The formation of the storage poly layer through two steps leads a topology to be improved as the thickness in the region of a bit line contact is shallow.

Second, a spacer controls the magnitude of a capacitance. While the etching process of the storage poly layer employing the oxide layer on the storage poly as an etching mask, the etching pattern of the oxide layer is restricted by the resolution capability of a photoresist. Therefore, since the size of the etching pattern is determined by the resolution capability, the quantity of the storage poly layer to be removed is also effected by the resolution capability. However, the spacers cause the remaining storage poly layer to be large as the portion thereof to be removed is small.

An undercut is included as one of three factors. The undercut is carried out in the region just below the boundary region of the storage poly layer. Accordingly the effective area is increased once more.

As depicted in FIG. 4, the stacked capacitor according to the invention is increased in a curved surface with the saddle mask, and the oxide layer under the storage poly layer is wrapped by a capacitor dielectric layer. Now we call this structure the saddled and wrapped stacked capacitor.

The invention, in another aspect, is a method of manufacturing the saddled and wrapped stacked capacitor DRAM.

DETAILED DESCRIPTION OF THE PREFERRED EMBODIMENT

The present invention will now be described in details with reference to the accompanying drawings.

Figure 1:
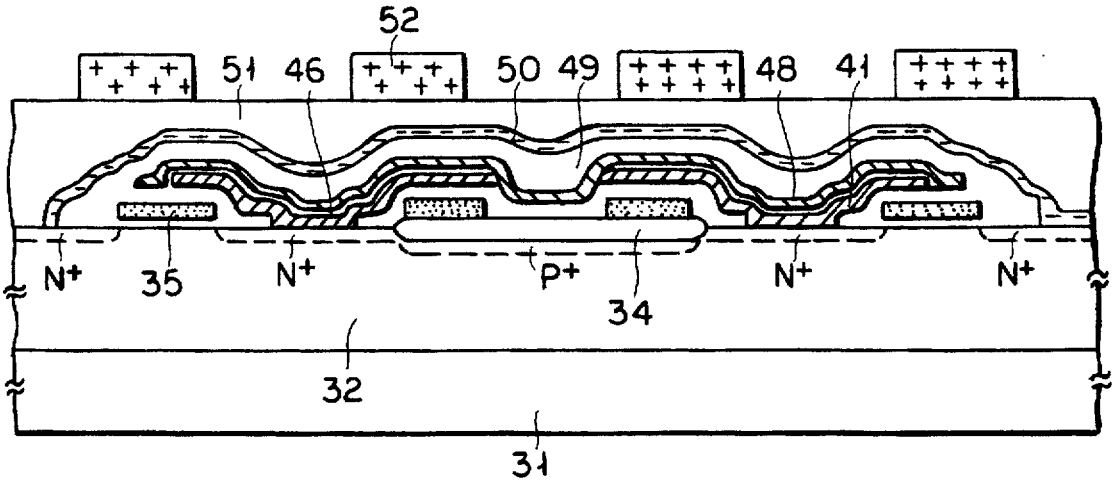
FIG. 1 PRIOR ART
FIG. 1 is a vertical cross-sectional view of a prior DRAM cell.
Figure 2:
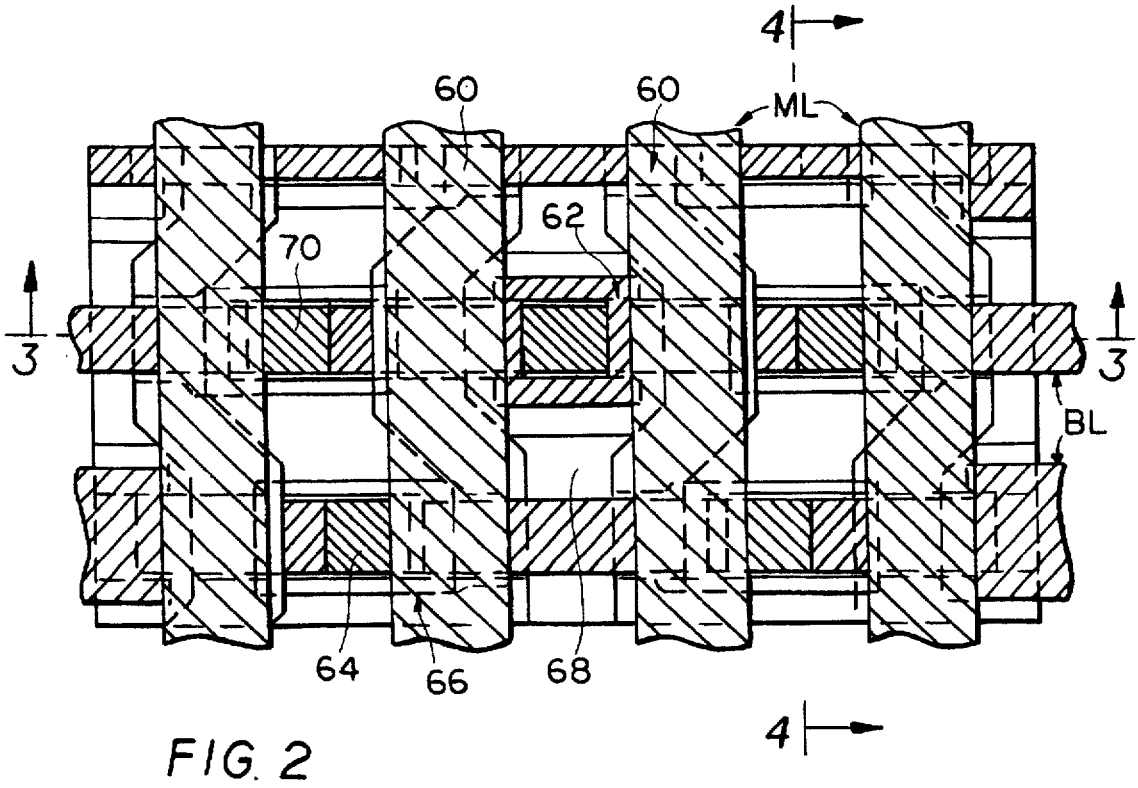
FIG. 2 is a plane layout of a stacked capacitor DRAM cell of this invention.

In FIG. 2, the reference numeral 60 is a gate poly and the numeral 62 is a saddle mask. The reference numerals 64, 66 are a buried contact and a storage poly respectively. The numeral 68 is a plate poly and a bit line contact is indicated by the numeral 70. The characters ML and BL shows a metal line and a bit line, respectively.

FIG. 5 is a vertical cross-sectional view showing in sequential order the steps of an embodiment for manufacturing a stacked capacitor DRAM. Referring now to FIG. 5A, a p-type well 2 and [a] *an* n-type well 3 are formed on a p-type substrate 1.

Hereinafter, the preferred embodiment of this invention will now be described by setting the p-well on the basis of describing the embodiment. For the n-well, only the type of impurities is changed.

Figure 5A:
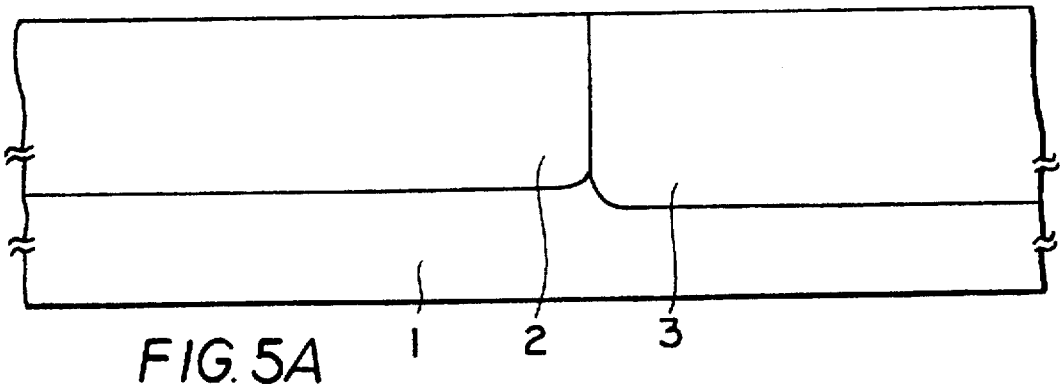
FIGS. 5A to 5L are vertical cross-sectional views of each process showing in sequential order the steps of an embodiment for manufacturing the DRAM cell of this invention.
Figure 5B:
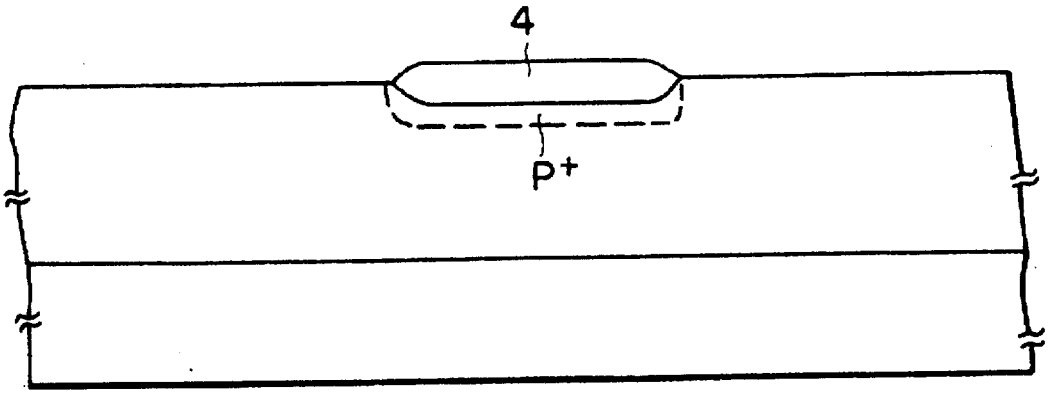

Impurities of p-type are injected into a region of the p-type well 2 which will be a field region in the well 2, and then a field oxide layer 4 is grown. From this resultant, a channel stop region of $p^+$-type is formed (FIG. 5B).

Figure 5C:
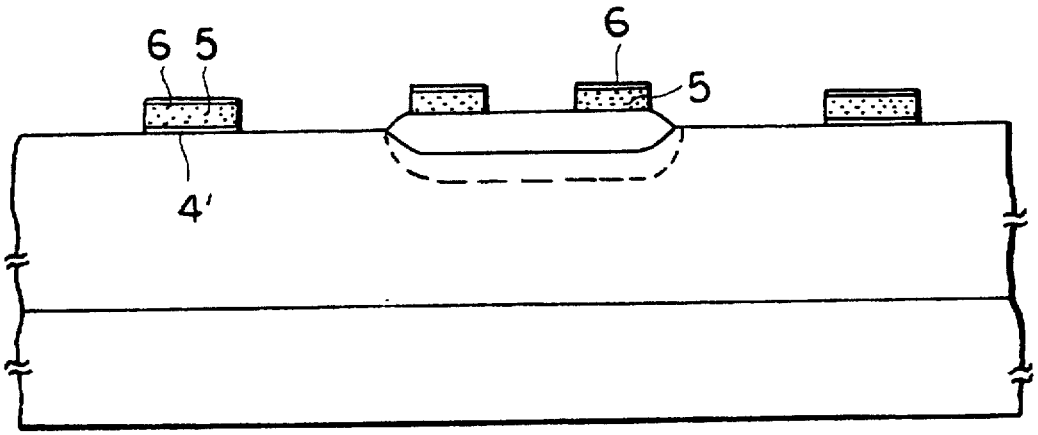

As shown in FIG. 5C, a gate oxide layer 4' is grown on regions to be active regions by way of a conventional way, and impurities are injected in order to control a threshold voltage of a transistor. A poly layer 5 is then deposited over the substrate, and a gate poly oxide layer 6 is grown on the poly layer. The layers 4', 5 and 6 are selectively etched out employing a conventional photo-lithographic technique, and the layer 5 results in a gate poly layer.

Figure 5D:
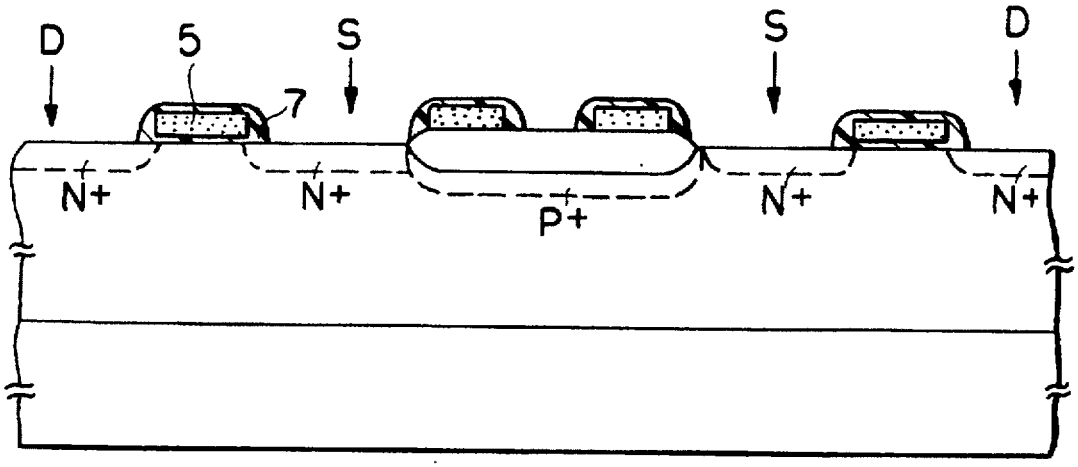

FIG. 5D shows an oxide spacer 7 which is formed in the sidewall of the poly-silicon layer 5. Ion impurities of n-type are then injected into the p-well so as to form the regions which come to be a source S and a drain D of a transistor.

Figure 5E:
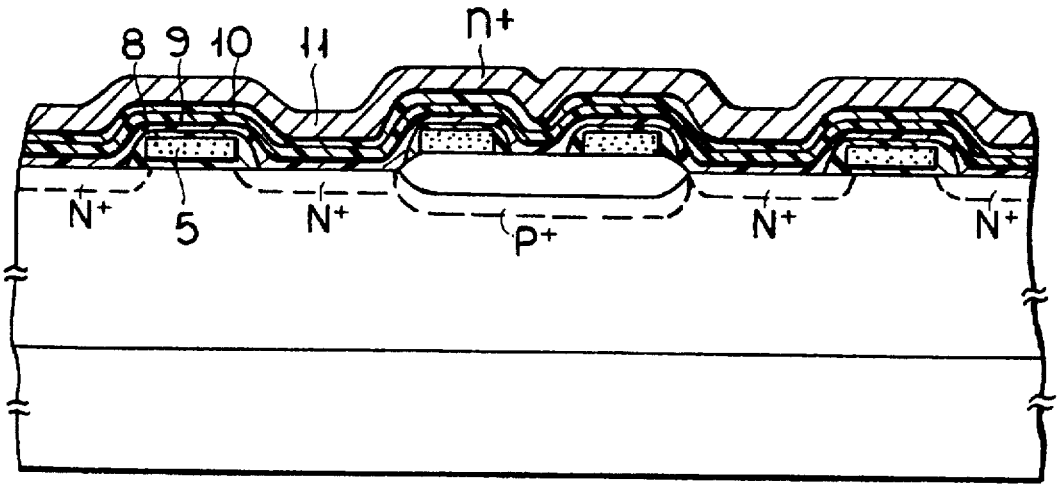

Thereafter, as shown in FIG. 5E, an oxide layer 8 (the lower oxide layer), a nitride layer 9 and an oxide layer 10 are formed in sequence. The layers 8,9,10 are formed by the method of Chemical Vapor Deposition, and the thickness of each layer is about 1000 Å. A first poly-silicon layer 11 is then coated with the thickness of about 3000 Å.

The layers 8,9 and 10 play the role of the inter-poly (laminated) insulating layer between the gate poly layer 5 and the first poly layer 11. The first poly layer may be formed with the poly doped initially with the $n^+$-type impurities, or $n^+$-type impurities may be doped after depositing the non-doped poly-silicon.

Figure 5F:
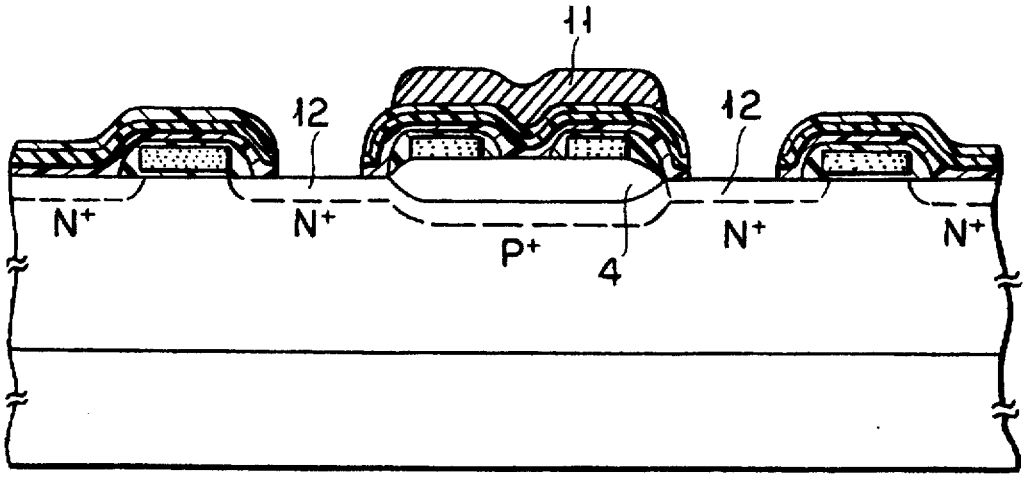

Referring now to FIG. 5F, the first poly layer 11 is selectively etched out, employing a saddle mask, except the poly-silicon coated over the upper surface side of the field oxide layer 4. During this process, the saddle mask causes the etched surface of the storage poly layer to be very rough so that this condition makes the effective area for the capacitor increase in a large scale. That is, the increment of the surface area with the curved surface states increases the quantity of the storage poly with respect to the another deposition of a poly-silicon layer.

Buried contacts 12 are then formed and the buried contact leads the source to be connected with a second poly which will be an electrode of a capacitor. The order of forming the first poly layer and the contact can be carried out reversely.

Figure 5G:
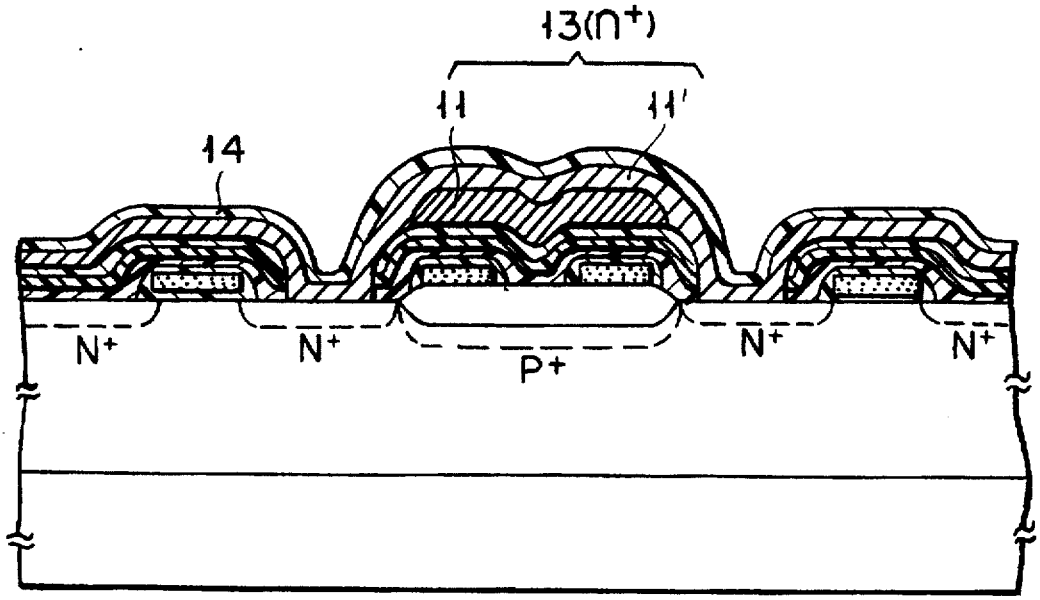

After that, as shown in FIG. 5G, the second poly layer 11' is deposited with about 2500 Å thickness over the entire surface of the p-well, and an oxide layer 14 is coated by the thickness of about 1500–3000 Å, by way of CVD technique, on the second poly layer. As above indicated, owing to the rough, etched surface of the poly layer 11, the upper surface of the portion of the second poly layer 11' overlying the first poly layer 11 is also rough.

Figure 5H:
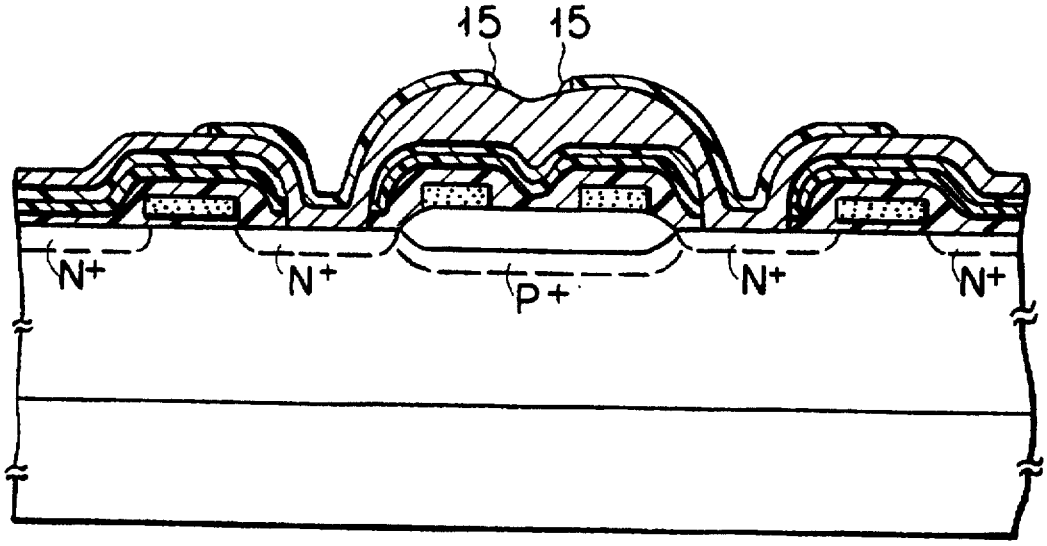

FIG. 5H shows the next step. The reference numeral 13 is a poly storage layer consisting of the first and second poly layer 11 and 11', and hereinafter the first and second poly-silicon layer (laminate) 11, 11' will be represented as the poly storage layer and a single hatching.

Employing a photoresist mask, the oxide layer 14 is selectively etched out per unit of a cell. In this etching process, the etching pattern of the oxide layer 14 is restricted by the resolution capability of the photoresist. Accordingly, the size of the etching pattern must be at least equal or large than the resolution capability. According to the present invention an oxide spacer is employed in order to maximize the capacitance. After forming the etching pattern of the storage poly, an oxide layer is coated on the oxide layer 14. The oxide spacer 15 is then formed through the etch back technique. The size of the spacer is determined with the magnitude of the storage layer to be remained, that is, with the capacitance of a capacitor according to a device characteristic.

Figure 5I:
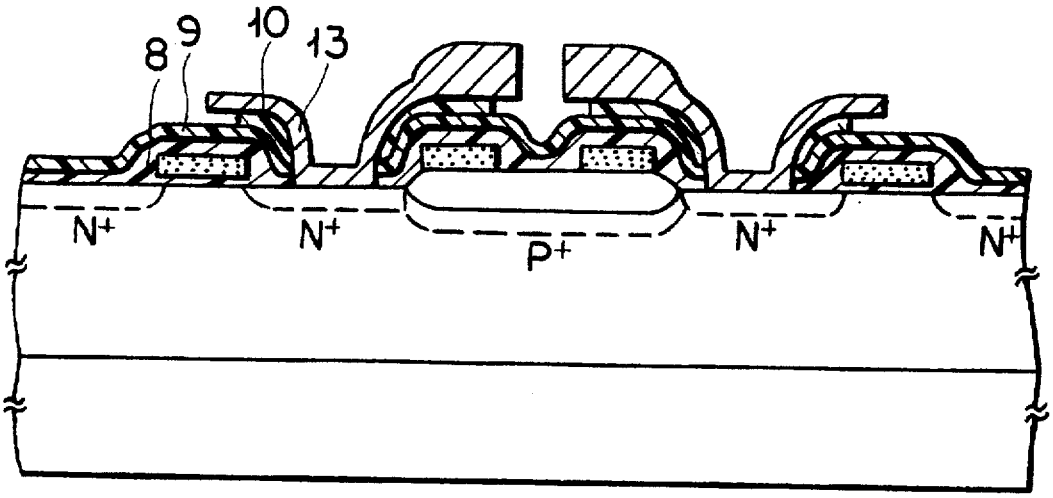

In FIG. 5I, the exposed storage poly layer 13 is removed by employing the remaining oxide layer 14 and oxide spacer 15 as a mask. This etching process exposes the portions of the oxide layer 10 below the removed storage layer. Subsequently, using the isotropic technique the oxide layers 10, 14 are removed. The isotropic etching makes the oxide layer 10 (the uppermost lamina of the laminated insulating layer 8-9-10) have undercut surfaces because the boundary portions of the oxide layer 10 is etched out into apertures by the isotropic properties. Therefore, the exposed portions of the storage poly are increased, and the storage capability for charges is also increased.

The degrees of the undercut depend on the magnitude of capacitance to be obtained, and these are controlled by the difference of the thickness between the oxide layer 10 and 14. If the layer 14 is thicker than the layer 10, the degrees of the etching in the layer 10 may increase. The removal of the layer 10, 14 may be carried out separately.

Figure 5J:
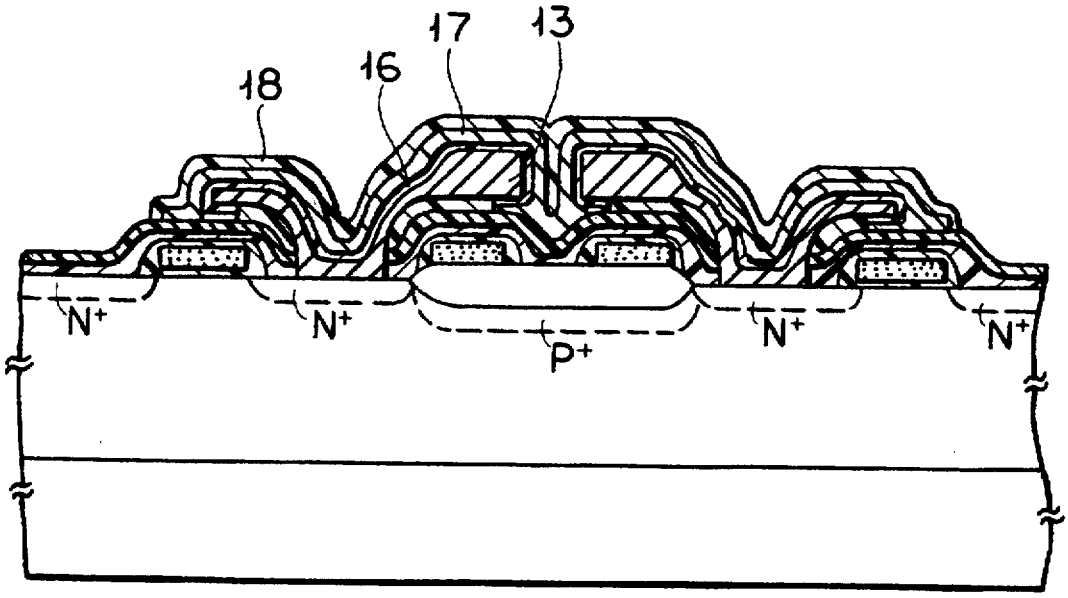

The protection by the nitride layer 9 (the lamina exposed by the undercutting of the layer 10) for the oxide layer 8 prevents the short between the gate poly layer 5 and a plate poly layer 17 represented in FIG. 5J from occurring.

Referring now to FIG. 5J, a dielectric layer 16 for a capacitor is formed along the entire exposed surface of the storage poly layer 13. The plate poly layer 17 is then deposited over the p-well by about 1500 Å, and then the plate poly layer 17 is selectively removed as shown in FIG. 5J.

Then a plate poly oxide layer 18 is grown by oxidizing the plate layer 17 so as to have the thickness of about 1000 Å.

Figure 5K:
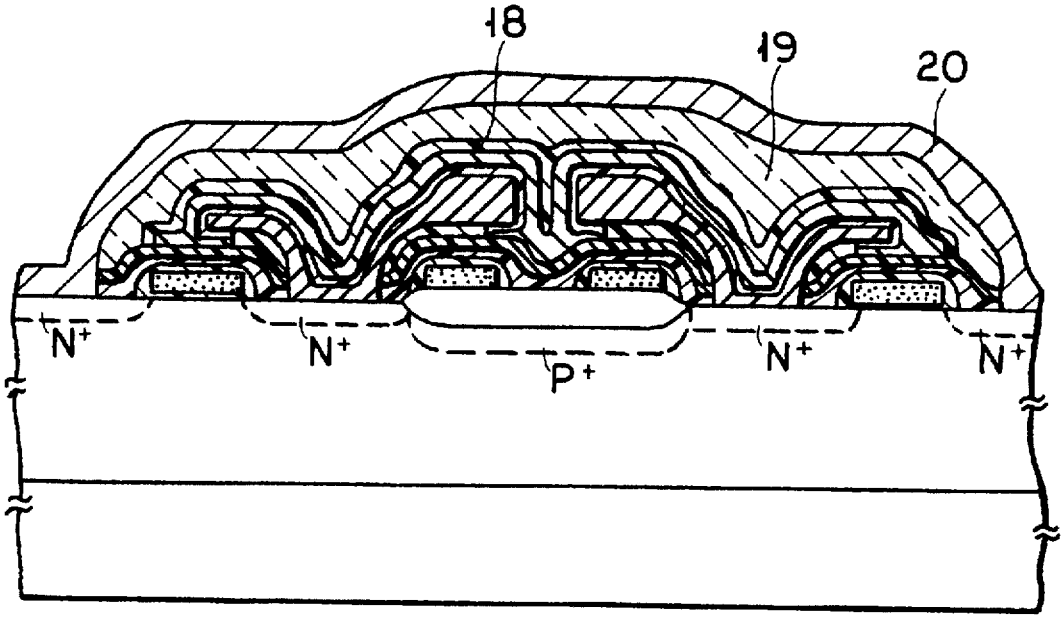

As shown in FIG. 5K, the BPSG(Boron Phosphorus Silicate Glass) 19 is deposited on the plate poly oxide layer 18 by the low temperature oxidation technique. A BPSG flow is then carried out for the planarization of the surface. Employing a mask, a bit line contact is formed and a policide layer 20 is filled therein.

Figure 5L:
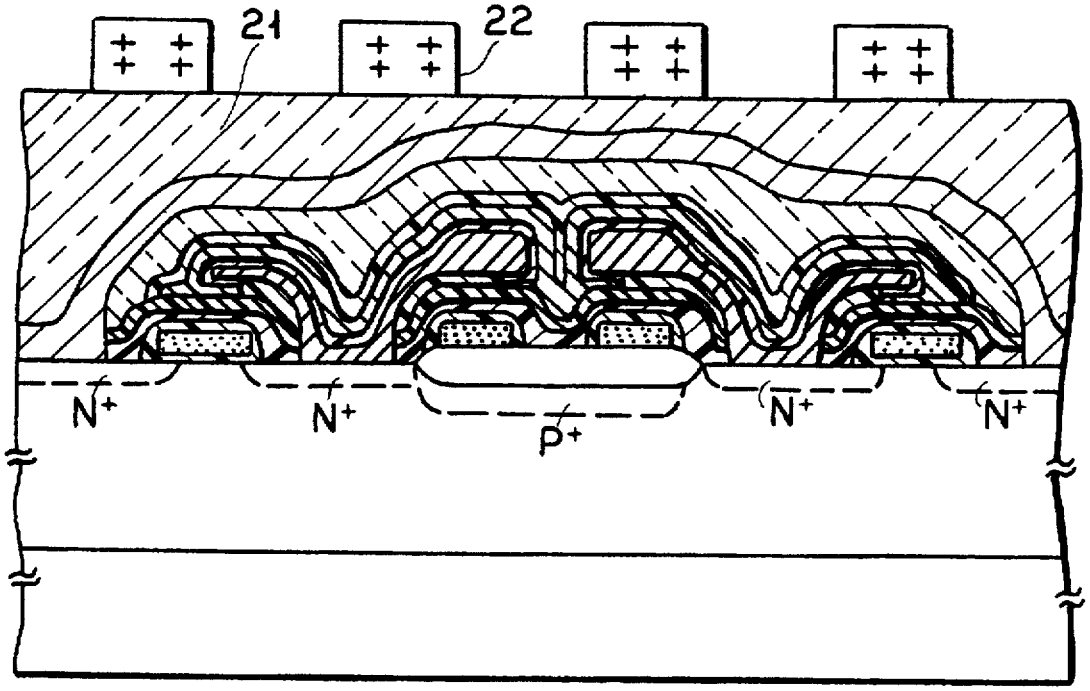

After the above processes, in FIG. 5L, the BPSG 21 is coated and the glass 21 is flowed. A contact for metal line is then formed using a mask and a metal layer is deposited. The coated metal layer is selectively removed employing a mask.

Figure 3:
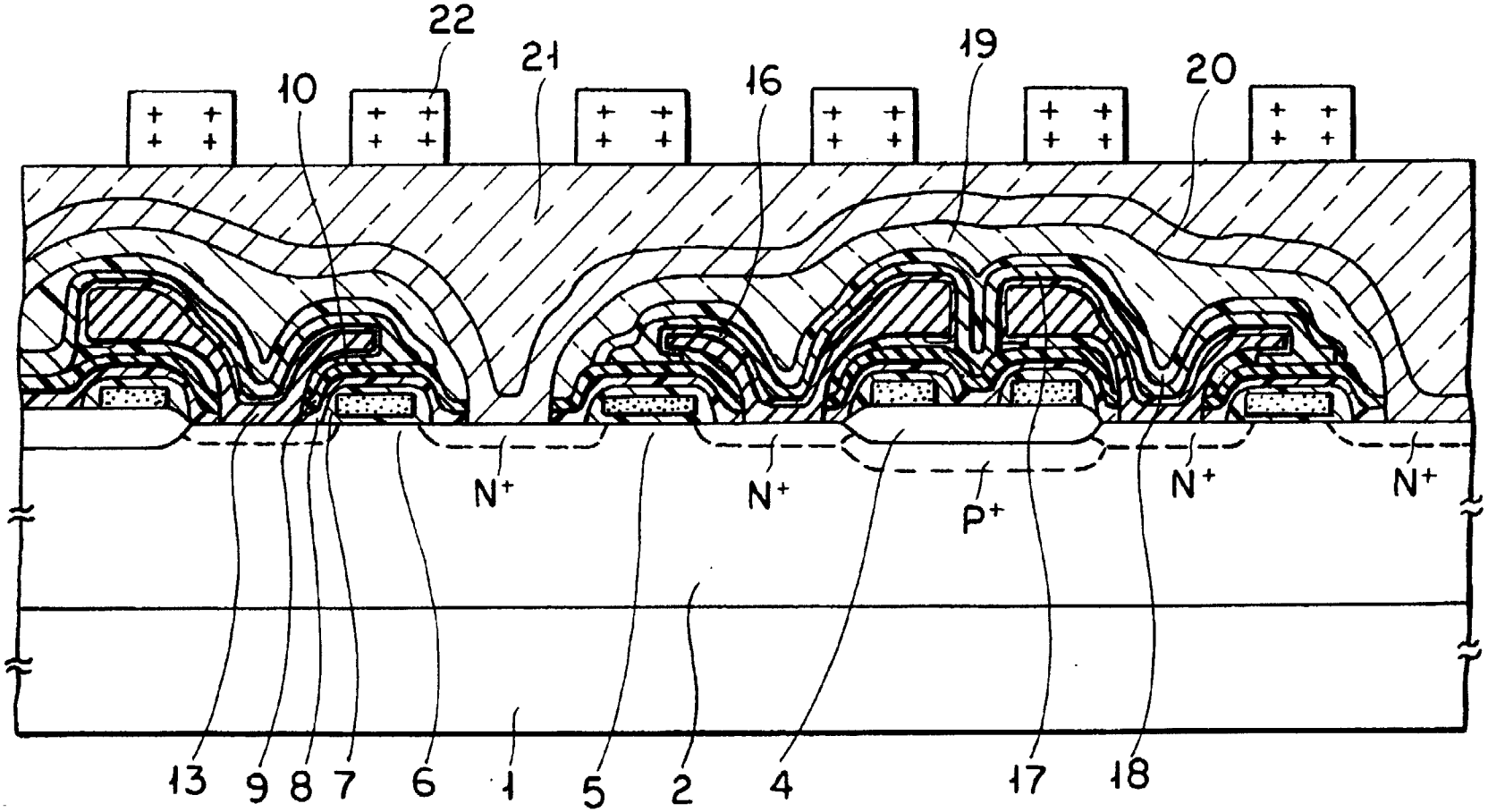
FIG. 3 is a vertical cross-sectional view of FIG. 2 taken along line A–A' thereof.
Figure 4:
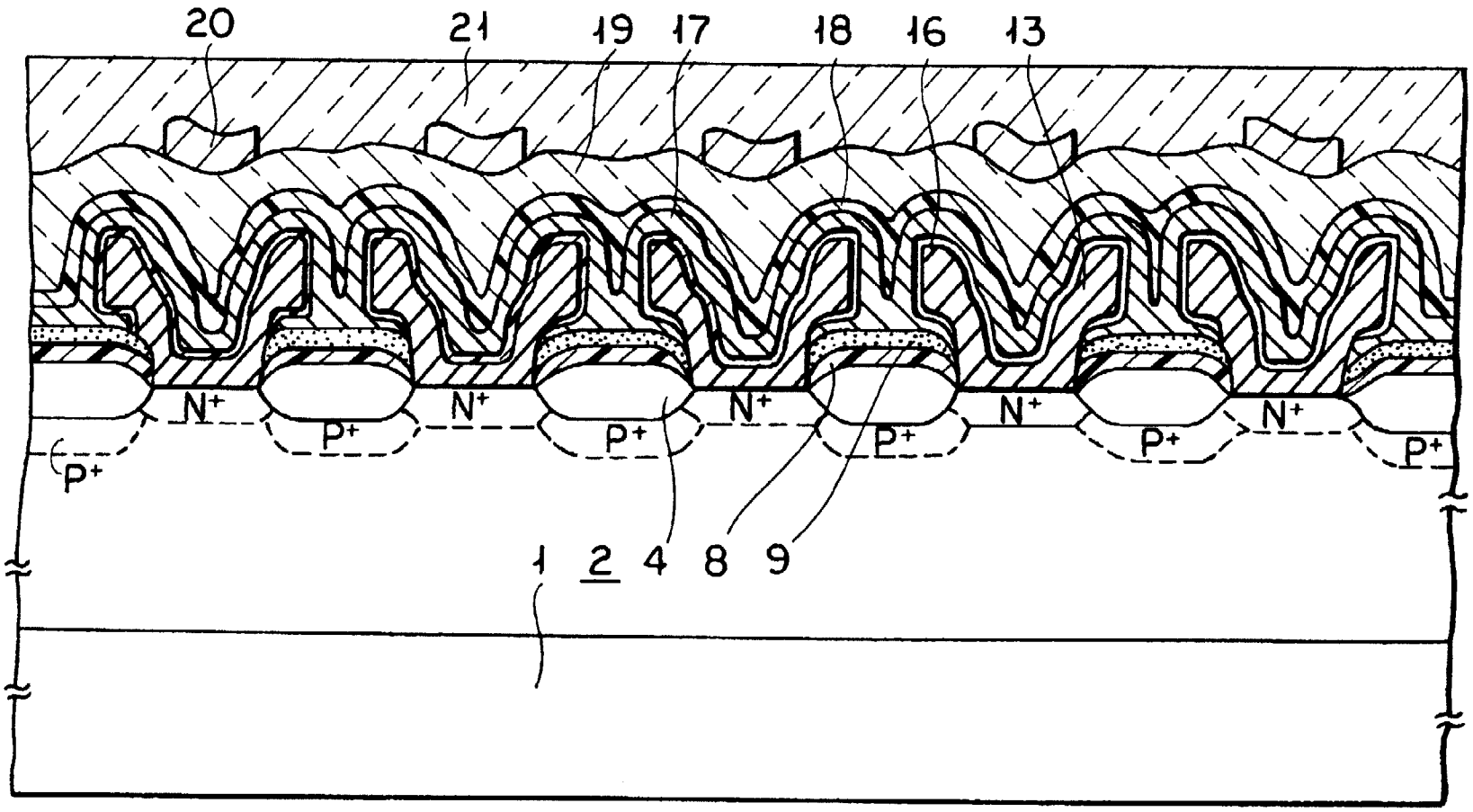
FIG. 4 is a vertical cross-sectional view of FIG. 2 taken along line B–B' thereof.

The DRAM cell fabricated through the above-mentioned processes has a wide effective area for the capacitor as shown be in FIG. 2 and FIG. 3, because the storage poly-silicon for capacitor is formed with an enough thickness over the field oxide layer 4, as well as the exposed area of the storage poly layer 13 is increased by [causing] *providing* the undercut just below the boundary region of the storage layer [to bring about;] so that the effective area of the capacitor results in wide area. Furthermore, with the employment of the oxide spacer, the magnitude of capacitance is increased and controlled with the dimensions of the oxide spacer.

The effects of the DRAM cell manufactured according to the present invention are as follows.

Since the storage poly layer to be the capacitor electrode is formed not only thick in the region over the field oxide layer but also shallowly in the contact region of the bit line, the effective area of the capacitor increases and the topology of the bit line contact area is improved.

When the storage poly is removed, the gap between the remaining storage poly layer is narrow as much as possible by using the oxide spacer, so that the remaining area of the storage poly layer is wide and the effective area of the capacitor is increased once more.

The third factor which increases the capacitor area is the undercut phenomenon which breaks down in the region just below the boundary region of the storage poly layer.

Accordingly, since the effective area for the capacitor is enormously increased through the above-mentioned three factors according to the invention, the area of the DRAM decreases, and this result makes the manufacturing of the VLSI possible.

This invention is in no way limited to the example described hereinabove. Various modifications of the disclosed embodiment, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. A stacked capacitor DRAM formed on a substrate comprising a plurality of memory cells on said substrate, each of said cells comprising a charge transfer transistor and a stacked capacitor, said stacked capacitor comprising a laminated insulating layer having a plurality of laminae disposed on a portion of the substrate, said insulating layer terminating in a side edge, a storage polysilicon layer for said capacitor including a first portion disposed on said insulating layer and a second portion extending beyond the side edge thereof, said second portion extending to and overlying a gate of said charge transfer transistor, said first portion having a greater thickness than said second portion, said polysilicon layer terminating in a side edge, and including a conductive layer separated from said polysilicon layer by a dielectric layer, said conductive and dielectric layers extending over an upper surface of said polysilicon layer, along said side edge thereof, and beneath a section of said first portion of said polysilicon layer, an edge of a first, uppermost lamina of said insulating layer being disposed beneath and inwardly of said side edge of said polysilicon layer [thereby providing a space between a bottom surface portion of said polysilicon layer] thereby providing a space between a bottom surface portion of said polysilicon layer and a surface portion of a second lamina of said insulating layer beneath said uppermost lamina, and said space being filled with the portions of said conductive and dielectric layers extending beneath said polysilicon layer whereby said conductive and dielectric layers do not surround said storage polysilicon layer.

2. A stacked capacitor as in claim 1 including a conductive member disposed beneath said polysilicon layer, and wherein said second lamina of said [insulting] *insulating* layer insulates the portion of said conductive layer extending beneath said polysilicon layer from said conductive member.

3. The DRAM according to claim 1 wherein said second portion of said storage polysilicon layer is substantially uniform in thickness.

4. The DRAM according to claim 2 wherein said second portion of said storage polysilicon layer is substantially uniform in thickness.

5. The DRAM according to claim 1 wherein said laminated insulating layer comprises 3 laminae, the insulating material of the center lamina being of a different insulating material than [a] *an* upper lamina thereof.

6. The DRAM according to claim 2 wherein said laminated insulating layer comprises 3 laminae, the insulating material of the center lamina being of a different insulating material than [a] *an* upper lamina thereof.

7. The DRAM according to claim 3 wherein said laminated insulating layer comprises 3 laminae, the insulating material of the center lamina being of a different insulating material than [a] *an* upper lamina thereof.

8. The DRAM according to claim 4 wherein said laminated insulating layer comprises 3 laminae, the insulating material of the center lamina being of a different insulating material than [a] *an* upper lamina thereof.

*9. A semiconductor memory device, comprising:*

*a semiconductor substrate having a gate electrode formed thereon with said gate electrode having an insulating layer formed thereon;*

*a first capacitive electrode layer formed on said insulating layer, said first capacitive electrode layer having an edge portion spaced apart from said insulating layer thereby exposing a partial lower surface of said first capacitive electrode layer at said edge portion;*

*a dielectric layer formed on said first capacitive electrode layer, said dielectric layer wrapping around and under said edge portion and substantially along said partial lower surface of said first capacitive electrode layer; and*

*a second capacitive electrode layer formed on said dielectric layer, said second capacitive layer wrapping around and under said edge portion, whereby said second capacitive electrode layer extends between said dielectric layer and said insulating layer.*

*10. The semiconductor device of claim 9, wherein said partial lower surface of said first capacitive electrode layer and said insulating layer define an undercut region under said first capacitive electrode layer.*

*11. The semiconductor device of claim 10, wherein said undercut region is of variable size.*

*12. The semiconductor device of claim 9, wherein said partial lower surface defines inner and outer ends of said edge portion extending over said gate electrode.*

*13. The semiconductor device of claim 12, wherein said inner and outer ends of said edge portion terminate within a vertical plane defined by first and second sides of the gate electrode.*

*14. The semiconductor device of claim 13, wherein the outer end of said edge portion extends a first lateral distance over said gate electrode and said inner end of said edge portion extends a second lesser distance over said gate electrode.*

*15. The semiconductor device of claim 12, wherein said inner end of said edge portion terminates within a vertical plane defined by first and second sides of the gate electrode, and said outer end of said edge portion terminates outside of the vertical plane defined by the first and second sides of the gate electrode.*

*16. A semiconductor memory device, comprising:*

*a semiconductor substrate having a gate electrode formed thereon with said gate electrode having an insulating layer formed thereon, wherein said insulating layer is a laminated insulating layer comprising a plurality of laminae;*

*a first capacitive electrode layer formed on said insulating layer, said first capacitive electrode layer having an edge portion spaced apart from said insulating layer thereby exposing a partial lower surface of said first capacitive electrode layer at said edge portion;*

*a dielectric layer formed on said first capacitive electrode layer, said dielectric layer wrapping around and under said edge portion and substantially along said partial lower surface of said first capacitive electrode layer; and*

*a second capacitive electrode layer formed on said dielectric layer, said second capacitive layer wrapping around and under said edge portion, whereby said second capacitive electrode layer extends between said dielectric layer and said insulating layer.*

*17. A stacked capacitor as in claim 16, wherein said insulating layer comprises upper, center and lower lamina.*

*18. A stacked capacitor as in claim 17, wherein an insulating material of said center lamina is different than an insulating material of said upper lamina.*

*19. A stacked capacitor as in claim 18, wherein said insulating material of said center lamina is nitride and said insulating material of said upper lamina is oxide.*

*20. A stacked capacitor as in claim 19, wherein said insulating material of said lower lamina is oxide.*

*21. A stacked capacitor as in claim 19, wherein said comprising a conductive member disposed beneath said first capacitive electrode layer, and wherein said center lamina of said insulating layer insulates a portion of said second capacitive electrode layer extending beneath said first capacitive electrode layer from said second capacitive electrode layer.*

*22. A stacked capacitor as in claim 9, wherein said partial lower surface defines an undercut extending over said gate electrode.*

*23. A stacked capacitor as in claim 9, wherein said partial lower surface defines an undercut extending over a word line.*

*24. A stacked capacitor as in claim 9, having at least one of a partial lower surface defining a first undercut extending over said gate electrode, and a partial lower surface defining a second undercut extending over a word line.*

*25. A stacked capacitor as in claim 9, having a partial lower surface defining a first undercut extending over said gate electrode, and a partial lower surface defining a second undercut extending over a word line.*

*26. A semiconductor memory device, comprising:*

*a semiconductor substrate having a gate electrode formed thereon with said gate electrode having an insulating layer formed thereon;*

*a first capacitive electrode layer having a first portion formed on said insulating layer and a second portion having an edge portion spaced apart from said insulating layer thereby exposing a partial lower surface of said first capacitive electrode layer at said edge portion;*

*a dielectric layer formed on said first capacitive electrode layer, said dielectric layer wrapping around and under said edge portion and substantially along said partial lower surface of said first capacitive electrode layer; and*

*a second capacitive electrode layer formed on said dielectric layer, said second capacitive layer wrapping around and under said edge portion, whereby said second capacitive electrode layer extends between said dielectric layer and said insulating layer.*

*27. A stacked capacitor as in claim 26, wherein said first portion of said first capacitive electrode layer is substantially uniform in thickness.*

*28. A stacked capacitor as in claim 26, wherein said second portion of said first capacitive electrode layer is substantially uniform in thickness.*

*29. A stacked capacitor as in claim 28, said first portion having a greater thickness than said second portion.*

*30. A stacked capacitor DRAM formed on a substrate comprising a plurality of memory cells on said substrate, each of said cells comprising a charge transfer transistor and a stacked capacitor, said stacked capacitor comprising:*

*a laminated insulating layer terminating in a side edge;*

*a storage polysilicon layer for said capacitor including a first portion disposed on said insulating layer and a second portion extending beyond the side edge thereof, said second portion extending to and overlying a gate of said charge transfer transistor,*

*said polysilicon layer terminating in a side edge, and including a conductive layer separated from said polysilicon layer by a dielectric layer, said conductive and dielectric layers extending over an upper surface of said polysilicon layer, along said side edge thereof, and beneath a section of said polysilicon layer, an edge of said insulating layer being disposed beneath and inwardly of said side edge of said polysilicon layer thereby providing a space between a bottom surface portion of said polysilicon layer and a top surface portion of said insulating layer, and said space being filled with the portions of said conductive and dielectric layers extending beneath said polysilicon layer whereby said conductive and dielectric layers do not surround said storage polysilicon layer.*

*31. A stacked capacitor as in claim 30, said laminated insulating layer comprising a plurality of laminae.*

*32. A stacked capacitor as in claim 31, wherein said insulating layer comprises upper, center and lower lamina.*

*33. A stacked capacitor as in claim 32, wherein an insulating material of said center lamina is different than an insulating material of said upper lamina.*

*34. A stacked capacitor as in claim 33, wherein said insulating material of said center lamina is nitride and said insulating material of said upper lamina is oxide.*

*35. A stacked capacitor as in claim 34, wherein said insulating material of said lower lamina is oxide.*

*36. A stacked capacitor as in claim 32, further comprising a conductive member disposed beneath said polysilicon layer, and wherein said center lamina of said insulating layer insulated a portion of said conductive member extending beneath said polysilicon layer from said conductive member.*

*37. A stacked capacitor as in claim 30, wherein said space, between the bottom surface portion of said first portion of said polysilicon layer and the top surface portion of said insulating layer, defines an undercut overlying a word line.*

*38. A stacked capacitor as in claim 30, wherein said space, between the bottom surface portion of said second portion of said polysilicon layer and the top surface portion of said insulating layer, defines an undercut overlying the gate of said charge transfer transistor.*

*39. A stacked capacitor as in claim 30, having at least one of*

*said space between the bottom surface portion of said first portion of said polysilicon layer and the top surface portion of said insulating layer, defining a first undercut overlying a word line, and*

*said space between the bottom surface portion of said second portion of said polysilicon layer and the top surface portion of said insulating layer, defining a second undercut overlying the gate of said charge transfer transistor.*

*40. A stacked capacitor as in claim 30, having said space between the bottom surface portion of said first portion of said polysilicon layer and the top surface portion of said insulating layer, defining a first undercut overlying a word line, and*

*said space between the bottom surface portion of said second portion of said polysilicon layer and the top surface portion of said insulating layer, defining a second undercut overlying the gate of said charge transfer transistor.*

*41. A stacked capacitor as in claim 30, wherein said first portion of said polysilicon layer is substantially uniform in thickness.*

*42. A stacked capacitor as in claim 41, wherein said second portion of said polysilicon layer is substantially uniform in thickness.*

*43. A stacked capacitor as in claim 42, said first portion having a greater thickness than said second portion.*

* * * * *